United States Patent [19]
Shin et al.

[11] Patent Number: 5,640,027
[45] Date of Patent: Jun. 17, 1997

[54] STATIC RANDOM ACCESS MEMORY DEVICE AND MANUFACTURING METHOD THEREOF

[75] Inventors: Heon-jong Shin; Young-kwang Kim, both of Seoul, Rep. of Korea

[73] Assignee: Samsung Electronics Co., Ltd., Suwon, Rep. of Korea

[21] Appl. No.: 507,721

[22] Filed: Jul. 26, 1995

[30] Foreign Application Priority Data

Jul. 26, 1994 [KR] Rep. of Korea .................. 94-18075

[51] Int. Cl.⁶ .................. H01L 27/10; H01L 29/00; H01L 29/76; H01L 27/11
[52] U.S. Cl. .................. 257/207; 257/538; 257/401; 257/903
[58] Field of Search .................. 257/207, 903, 257/401, 538; 437/48, 51, 52, 59

[56] References Cited

U.S. PATENT DOCUMENTS 4,907,057 3/1990 Ariizumi et al. .................. 257/538
5,436,506 7/1995 Kim et al. .................. 257/401
5,485,420 1/1996 Lage et al. .................. 257/903

OTHER PUBLICATIONS

Itabashi, K. et al., "A Split Wordline Cell for 16Mb SRAM Using Polysilicon Sidewall Contacts", *IEDM* (1991).
Ikeda, S. et al., "A Stacked Split Word–Line (SSW) Cell for Low Voltage Operation, Large Capacity, High Speed SRAMs", *IEDM* (1993).

*Primary Examiner*—Stuart S. Levy
*Assistant Examiner*—Adriana Giordana
*Attorney, Agent, or Firm*—Cushman Darby & Cushman, IP Group of Pillsbury Madison & Sutro L.L.P.

[57] ABSTRACT

A static random access memory (SRAM) device and a manufacturing method thereof are provided. In the SRAM memory device, a first active region of annular shape and a second active region bisecting the annulus are repeatedly formed over the whole cell array. Thus, since the contact hole for connecting the power line to the active region can be formed larger without increasing the cell size, contact resistance can be decreased. Also, the manufacturing method can be simplified since just one gate oxide layer formation process is needed.

12 Claims, 15 Drawing Sheets

5,640,027

STATIC RANDOM ACCESS MEMORY DEVICE AND MANUFACTURING METHOD THEREOF

BACKGROUND OF THE INVENTION

1. Field of the Invention

The present invention relates to a semiconductor device and a manufacturing method thereof, and more particularly, to a static random access memory device comprising a first active region having an annular shape and a second active region bisecting the annulus and a manufacturing method thereof.

2. Description of Related Art

Research into a static random access memory (SRAM) cell consisting of two transmitting transistors, two driving transistors and two resistors has been performed in various fields, including a CMOS SRAM using a silicon-on-insulator (SOI) layer for reducing the power consumption and required area of a memory cell. The CMOS SRAM uses a thin-film transistor (TFT), instead of polysilicon having high resistance, as a resistor, and is thus very useful for reducing standby current.

FIG. 1 is a general circuit diagram of an SRAM cell and shows a full CMOS SRAM using a PMOS TFT as the resistor.

The CMOS SRAM cell comprises an NMOS first transmitting transistor $T_1$ whose gate is connected to a word-line and whose drain (or source) is connected to a first bit line; an NMOS second transmitting transistor $T_2$ whose gate is connected to the word-line and whose drain (or source) is connected to a second bit line; an NMOS first driving transistor $T_3$ whose drain is connected to the source (or drain) of first transmitting transistor $T_1$, whose source is connected to a first constant power line $V_{ss}$ (i.e., ground) and whose gate is connected to the source (or drain) of second transmitting transistor $T_2$; an NMOS second driving transistor $T_4$ whose drain is connected to the source (or drain) of second transmitting transistor $T_2$, whose source is connected to first constant power line $V_{ss}$ and whose gate is connected to the source (or drain) of first transmitting transistor $T_1$; a first PMOS TFT $T_5$ whose drain is connected to the source (or drain) of first driving transistor $T_3$, whose source is connected to a second constant power line $V_{cc}$ and whose gate is connected to the gate of first driving transistor $T_3$ and the source (or drain) of second transmitting transistor $T_2$; and a second PMOS TFT $T_6$ whose drain is connected to the source (or drain) of second driving transistor $T_4$, whose source is connected to second constant power line $V_{cc}$ and whose gate is connected to the gate of second driving transistor $T_4$ and the source (or drain) of first transmitting transistor $T_1$.

FIG. 2 is a diagram showing a conventional layout of the SRAM cell, obtained from an article entitled "A Stacked Split Word-line (SSW) Cell for Low Voltage Operation, Large Capacity, High Speed SRAMs" (see: IEDM '93, pp809–812). Here, reference numeral 100 designates a mask pattern defining a semiconductor substrate into active and non-active regions, reference numerals 102 and 104 are mask patterns for forming the gates of first and second driving transistors, reference numerals 106 and 108 are mask patterns for forming the gates of first and second transmitting transistors, reference numeral 110 is a mask pattern for forming a contact hole for connecting first constant power line $V_{ss}$ to the active region, and reference numeral 112 is a mask pattern for forming first constant power line $V_{ss}$.

In FIG. 2, the layout drawn in the same mask is represented as the same kind of lines. For example, mask patterns 102 and 104 represented by a dot/dashed line are the layouts drawn in a first mask, and mask patterns 106 and 108 represented by two dots/dashed line are the layouts drawn in a second mask. Referring to FIG. 2, under the consideration of a general photo etching process in which one mask is used for one etching process, it is known that the gates of first and second transmitting transistors and the gates of first and second driving transistor are formed on different levels.

According to the layout of FIG. 2, mask pattern 110 for forming the contact hole for connecting first constant power line $V_{ss}$ to the active region is placed between mask patterns 104 for forming the gate of the driving transistor. Also, mask pattern 100 for forming the active region is arranged over the whole cell array, as an annular shape.

FIGS. 3A–3D are cross-sectional diagrams cut along line III—III' of FIG. 2 and FIGS. 4A–4D are cross-sectional diagrams cut along line IV—IV' thereof, for illustrating a conventional SRAM cell manufacturing process.

Referring to FIGS. 3A and 4A, a field oxide layer 12 is formed on the surface of a substrate 10 by an oxidation process adopting mask pattern 100. After a first gate oxide layer 14, a first conductive layer and a first insulating layer are stacked on the whole surface of the resultant structure, a photolithography process using mask patterns 102 and 104 is performed, so that gate (not shown) of first driving transistor $T_3$ and gate 16 of second driving transistor $T_4$ are formed. Subsequently, a second insulating layer is deposited on the whole surface and then etched back, so that spacers are formed on the sidewalls of the gates of first and second driving transistors $T_3$ and $T_4$. As a result, a first insulating layer 18 for insulating the gates of first and second driving transistors from another conductive layer (not shown) is formed.

Referring to FIGS. 3B and 4B, after sacrificially oxidizing the resultant, a wet etching is performed, so that the surface of the active region damaged by the processes for forming the gates of first and second driving transistors and first insulating layer 18 is cured. After a second gate oxide layer 20 and a second conductive layer are stacked on the whole surface of the resultant structure, a photolithography process is performed using mask patterns 106 and 108, so that gates 22 and 24 of first and second transmitting transistors $T_1$ and $T_2$ are formed. Then, impurities are doped on the whole surface of the resultant structure, and the source/drain regions 17, 19, 21 and 23 of each transistor are formed.

Referring to FIGS. 3C and 4C, after a third insulating layer is deposited on the resultant structure on which bulk transistors (that is, first and second transmitting transistors $T_1$ and $T_2$ and first and second driving transistors $T_3$ and $T_4$) are formed, the resultant structure is etched back, to thereby form spacers 26 on the sidewalls of gates 22 and 24 of the first and second transmitting transistors $T_1$ and $T_2$. Then, impurities are doped on the whole surface of the resultant structure, to thereby make the source/drain regions 21 and 23 of the first and second transmitting transistors $T_1$ and $T_2$ as a lightly doped drain (LDD) structure.

Referring to FIGS. 3D and 4D, after forming a second insulating layer 32 on the whole surface of the resultant structure, the photolithography process using mask pattern 110 is performed. Thus, the contact holes C for connecting first constant power line $V_{ss}$ with the source (not shown) of first driving transistor $T_3$ and with the source 19 of second driving transistor $T_4$ are formed while being self-aligned to the gates of first and second driving transistors. After depositing a third conductive layer on the whole surface of the resultant structure, the photo etching process using mask pattern 112 is performed, to thereby form first constant power line $V_{ss}$ 34 which connects to the active region via contact hole C.

According to the conventional layout diagram of the SRAM and the manufacturing method thereof, since the gates of the driving transistor and the transmitting transistor are formed on different conductive layers, the size of the unit cell can be reduced. There are, however, certain problems with the above conventional technique, as follows.

First, the gate oxidation layer is formed twice. That is, since gate oxidation layer 14 of the driving transistor and gate oxidation layer 20 of the transmitting transistor are separately formed, the process is complicated.

Second, since gate oxidation layer 20 of the transmitting transistor is formed after gate 16 of the driving transistor is formed, the quality of gate oxidation layer 20 of the transmitting transistor may be deteriorated due to the damages generated on the substrate surface during the formation of gate 16 of the driving transistor. During the processes shown in FIGS. 3B and 4B, the sacrificial oxidation and wet etching are performed to prevent the quality deterioration of the gate oxidation layer of the transmitting transistor, to thereby cure the damaged portion on which the gate oxidation layer of the transmitting transistor is formed. However, this complicates the process.

Third, the width of spacers A formed on the sidewalls of gate (not shown) of the first driving transistor and gate 16 of second driving transistor is different from that of spacers 26 formed on the sidewalls of gates 22 and 24 of the first and second transmitting transistors. Referring to FIGS. 3A and 4C, the width of spacers A formed on the sidewalls of gate (not shown) of the first driving transistor and gate 16 of second driving transistor is wider than that of spacers 26 formed on the sidewalls of gates 22 and 24 of the first and second transmitting transistors, because spacers 26 are formed through just one depositing/etching process while spacers A are formed through two such processes (i.e., for forming gate (not shown) of the first driving transistor and gate 16 of the second driving transistor and for forming gates 22 and 24 of the first and second transmitting transistors). The change of width of the spacers formed on the sidewalls of the gates directly effects a cell ratio. As described above, if the width of the spacers formed on the sidewalls of gates of the driving transistors is wider than that of the spacers formed on the sidewalls of the gates of the transistors, the cell ratio decreases in accordance with the ratio of the driving transistor's current to the transmitting transistor's current.

Fourth, the area of the contact hole decreases. That is, referring to FIG. 4D, if the distance between gates 16 is defined as a minimum feature size, the width of contact hole C formed therebetween decreases to below the minimum feature size due to the spacers A formed on the sidewalls of the gates during each etching back process, to thereby increase the contact resistance of first constant power line $V_{ss}$.

SUMMARY OF THE INVENTION

It is therefore an object of the present invention to provide a static random access memory device by which the problems caused from a conventional SRAM can be solved.

It is another object of the present invention to provide a method for manufacturing the above static random access memory device.

To achieve the first object of the present invention, there is provided a static random access memory (SRAM) device whose unit active region is comprised of a first active region having an annular shape and a second active region bisecting the first active region.

A contact hole for connecting a power line to the active region is formed on the second active region and the contact hole is shared by four cells. Here, the power line has planar shape.

The SRAM memory device further comprises first and second driving transistors and first and second transmitting transistors whose respective gates are formed of the same conductive layer and electrically separated from each other, contact holes formed on the gates of the first and second transmitting transistors, and a word-line connected to the gates of the first and second transmitting transistors via the contact holes.

Here, the word-line is formed perpendicular to the gates of the first and second driving transistors and the transistors each have a lightly doped drain structure.

The unit active regions are arranged such that a first column in which the unit active regions are repeatedly placed and a second column in which the unit active regions are repeatedly placed, and shifted by ½ pitch along the column from the unit active regions placed in the first column, are repeatedly placed over the whole cell array. Here, the unit active region is shared by four cells.

To achieve the second object of the present invention, there is provided a method for manufacturing a static random access memory (SRAM) device comprising the step (a) of forming an active region in a substrate, the active region including a first active region having an annular shape and a second active region bisecting the first active region.

According to a preferred embodiment of the present invention, the method for manufacturing an SRAM memory device, after the step (a), further comprises the steps of: (a') forming first and second driving transistor gates and first and second transmitting transistor gates on the substrate; (b') forming a contact hole on each gate of the first and second transmitting transistors; and (c') forming the word-line connected to the gates of the first and second transmitting transistors via the contact hole.

After the step (a'), the method further comprises the steps of: (a") implanting impurity ions on the resultant structure on which the gates are formed; (b") forming an insulating layer on the whole surface of the resultant structure after the step (a"); (c") forming spacers on the sidewalls of the transistors by etching back the insulating layer; and (d") doping impurities on the resultant structure on which the spacers are formed, to thereby form the source/drain of LDD structure.

According to another preferred embodiment of the present invention, the method for manufacturing an SRAM memory device, after step (a), further comprises the steps of: (a''') forming a contact hole by which the second active region is partially exposed; and (b''') forming a power line connected to the second active region via the contact hole.

Therefore, since the gate oxide layer is not formed twice, the manufacturing process is simplified and the change of the cell ratio, caused by the different width of spacers, can be prevented. Also, the width of the contact hole can be maintained as a minimum feature size, so that the increase of the contact resistance, caused by the decrease in the width of the contact hole due to the spacers formed on the sidewalls of the gates, can be prevented.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The method for manufacturing the SRAM cell according to the present invention will be described in detail with reference to FIGS. 5A–5E and 6A–6F.

Figure 5A:
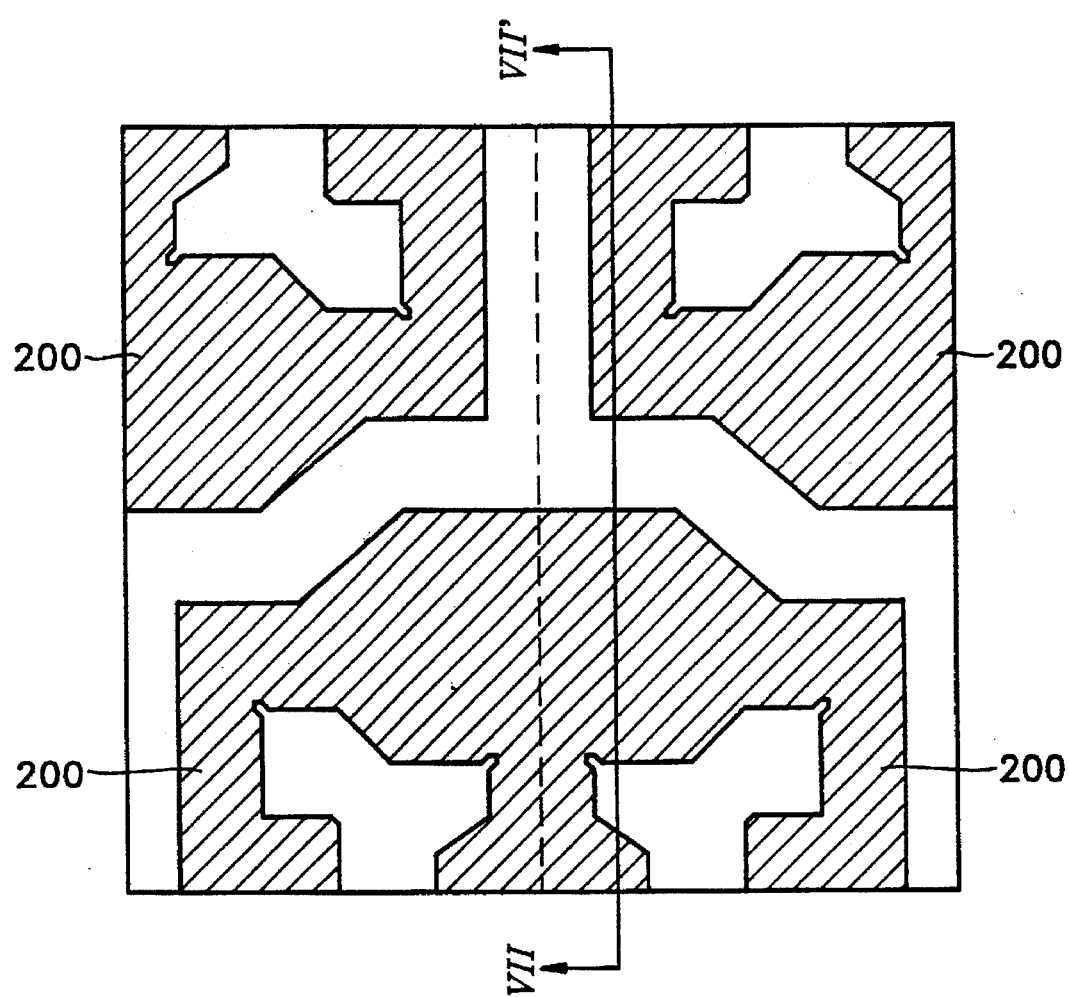
FIGS. 5A–5E are exploded layout diagrams for sequentially illustrating the manufacturing process steps according to the present invention.
Figure 6A:
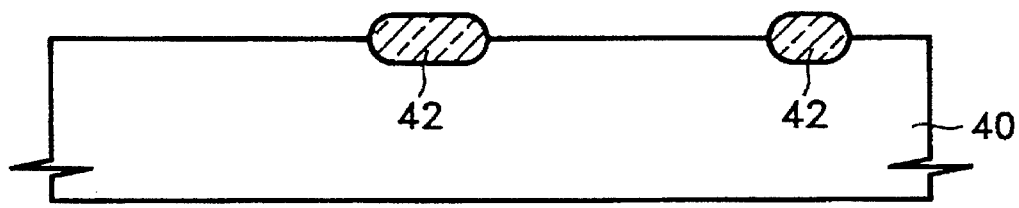
FIGS. 6A–6F are cross-sectional diagrams cut along line VII—VII' of FIGS. 5A–5E, for illustrating the method for manufacturing the SRAM cell of the present invention.

First, as shown in FIGS. 5A and 6A, a field oxide layer 42 for dividing semiconductor substrate 40 into the active and non-active regions is formed according to a conventional method using mask patterns 200.

FIG. 5A shows a cell unit which is symmetrical with respect to a central vertical dashed line. The unit cell shown in FIG. 5A is symmetrically arranged with respect to the horizontal and vertical axes, and this arrangement is repeated throughout the whole cell array.

Figure 5B:
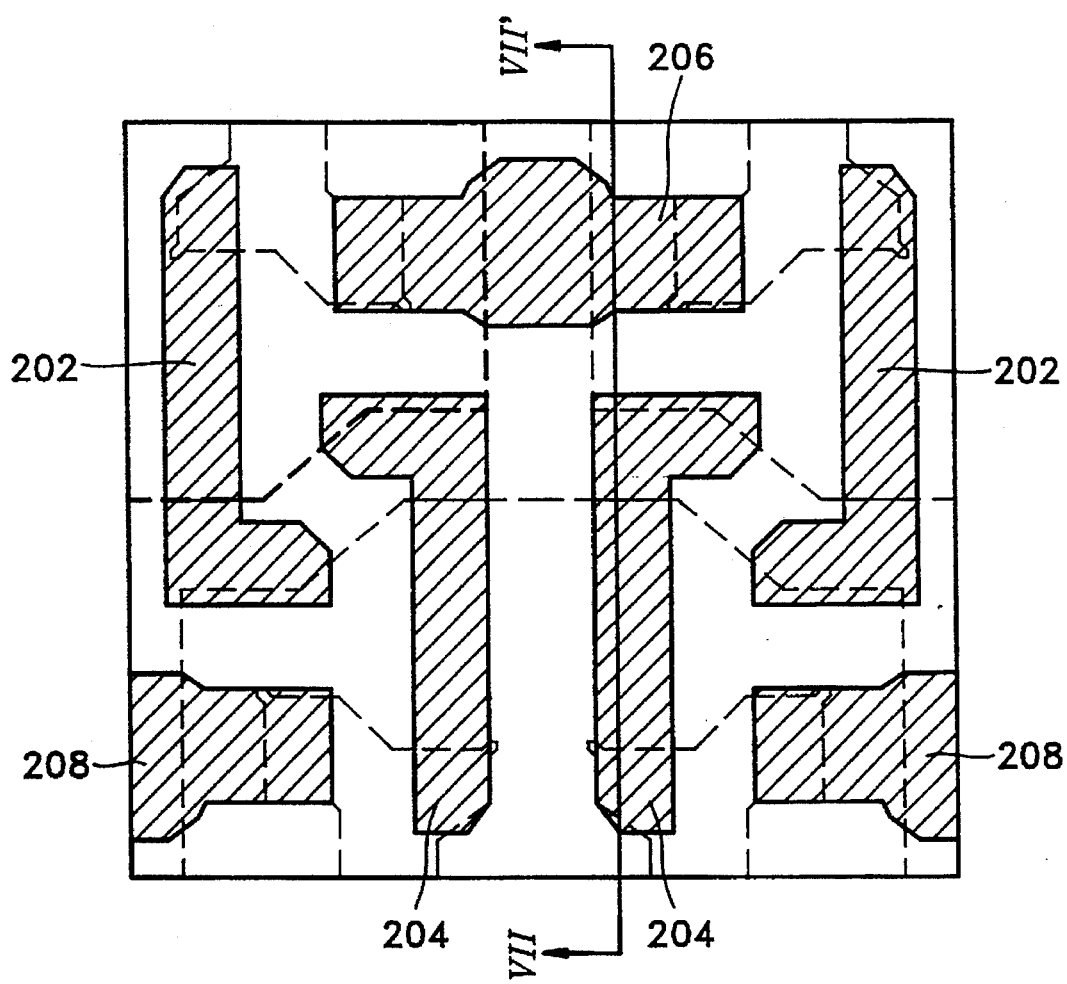
Figure 6B:
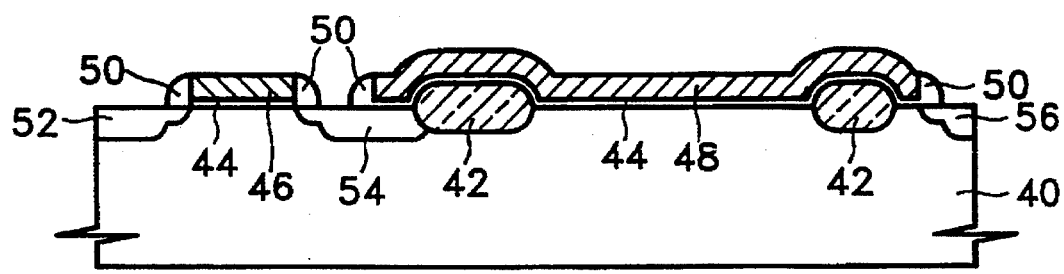

Referring to FIGS. 5B and 6B illustrating the process for forming the bulk transistors, the process comprises the steps of: stacking a gate oxide layer 44 and a first conductive layer on the semiconductor substrate on which field oxide layer 42 is formed and performing a photolithography process using mask patterns 206, 208, 202 and 204 to form gate 46 of the first transmitting transistor and gate (not shown) of the second transmitting transistor and the gate (not shown) of the first driving transistor and gate 48 of the second driving transistor; doping impurities using the gates as the mask; forming an insulating layer on the resultant structure and etching-back the insulating layer to form spacers 50 on the sidewalls of the gates; and forming source/drain regions 52, 54 and 56 of the bulk transistors of LDD structure by again doping the impurities on the semiconductor substrate.

According to the above process, the gates of the bulk transistors are formed using one mask. That is, differently from the conventional SRAM manufacturing process in which the gates of the driving transistor are formed on the first conductive layer and the gates of the transmitting transistor are formed on the second conductive layer, the gates are formed on the one conductive layer so that it is not necessary to twice perform the process for forming gate oxide layer. Here, the gates of the transistors are separately formed as shown in FIG. 5B, so as to minimize the cell size. Then, the gates of the transmitting transistors are connected to the word-line according to the following process.

Since the gates of all the bulk transistors are simultaneously formed through a one-time masking process, there is no occurrence of a phenomenon where the width of the spacers formed on the sidewalls of the gate of the transmitting transistor is different from that of the spacers formed on the sidewalls of the gate of the driving transistor. Thus, different from the conventional SRAM cell, there is no cell ratio decrease caused by the different width of the spacers.

Also, according to the manufacturing method of the present invention, all bulk transistors can be formed in an LDD structure, differently from the conventional SRAM cell manufacturing method in which only the transmitting transistor has an LDD structure.

Figure 5C:
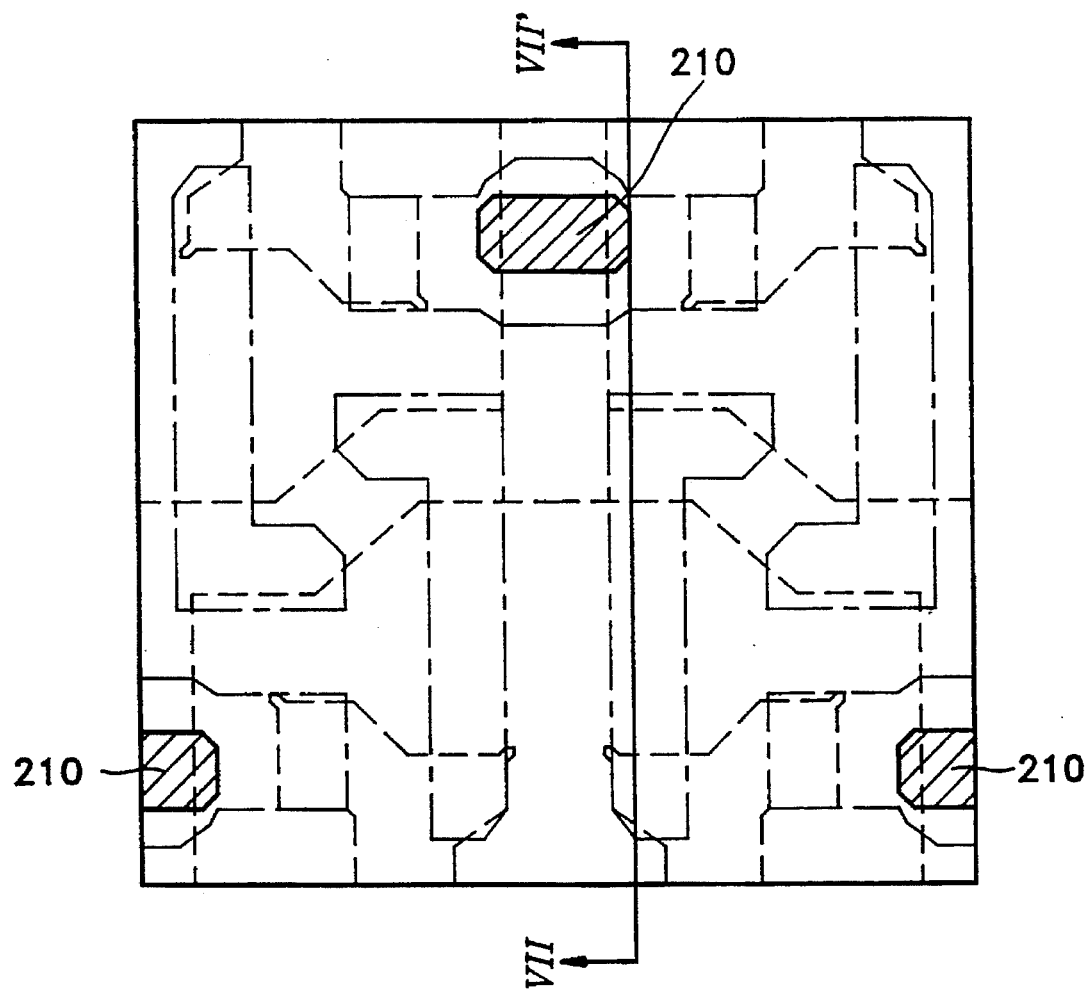
Figure 6C:
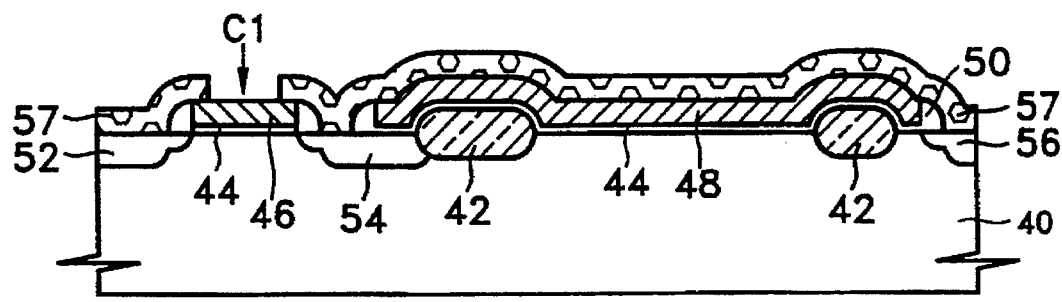

FIGS. 5C and 6C show the process for forming a contact hole C1 for connecting the word-line to the gates of the transmitting transistor. The process is composed of the steps of: forming a first insulating layer 57 on the resultant structure on which the bulk transistors are formed, by depositing an insulator such a high temperature oxide (HTO) layer; and partially removing first insulating layer 57 formed on gates 44 of the transmitting transistor through a photolithography process using mask patterns 210, so as to form contact hole C1.

Figure 5D:
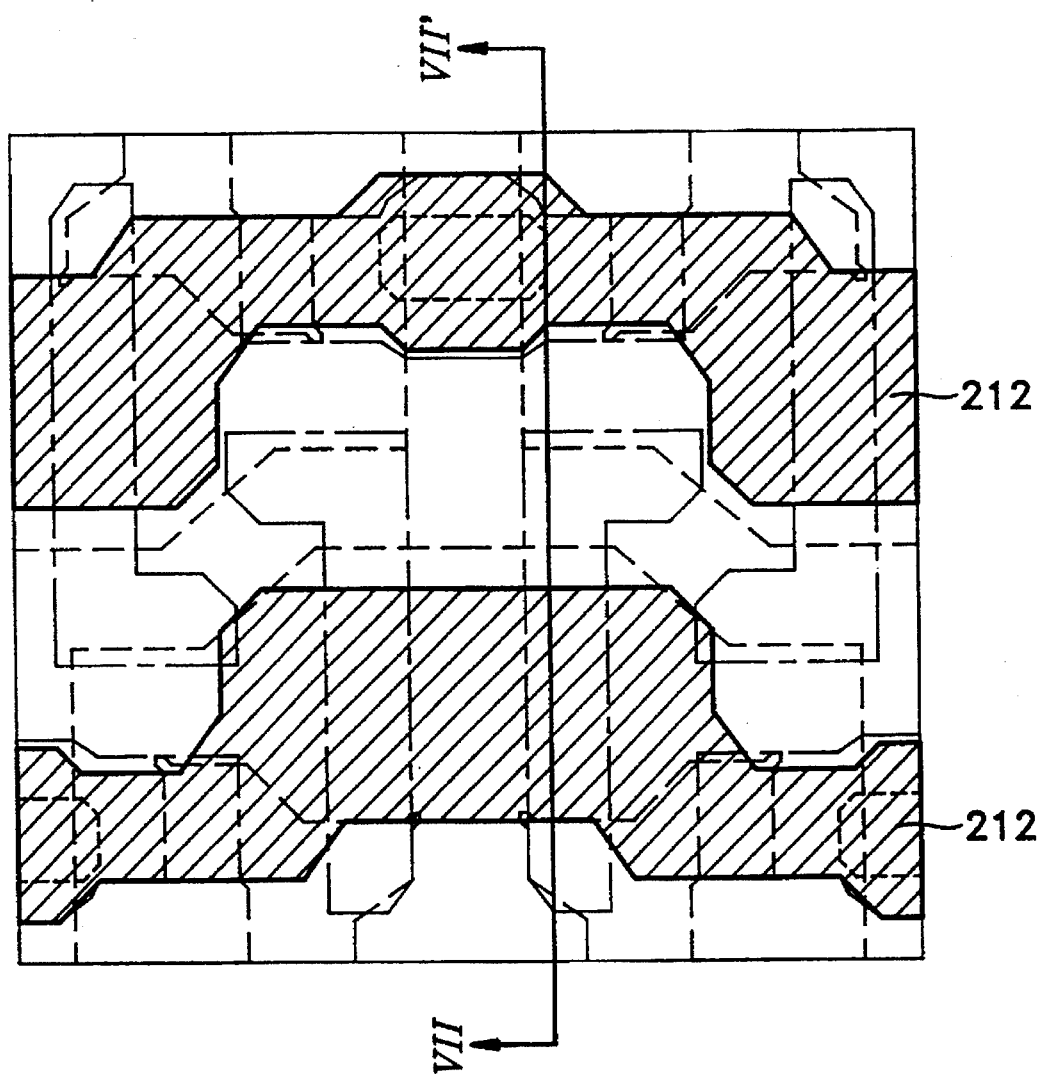
Figure 6D:
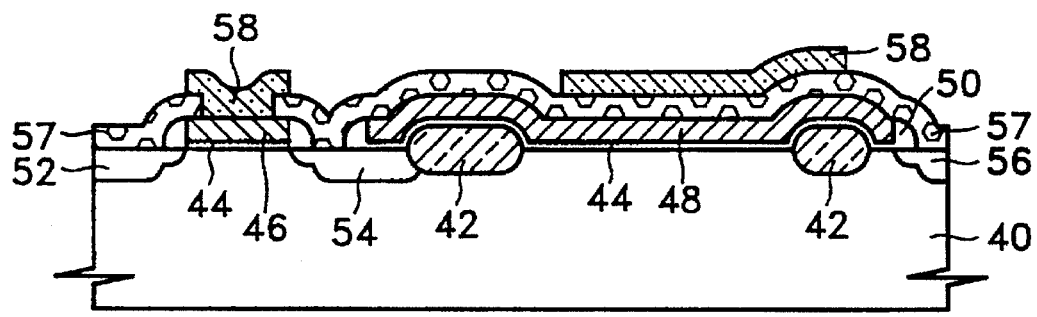

FIGS. 5D and 6D are diagrams for illustrating the process for forming word-line 58. The process is composed of the steps of: depositing a second conductive layer on the resultant structure on which contact hole C1 for connecting the word-line to the gates of the transmitting transistor is formed; and forming word-line 58 connected to the gates of the transmitting transistor via contact hole C1 by performing a photolithography process on the second conductive layer using mask patterns 212. Here, as shown in FIG. 5D, word-line 58 is arranged perpendicular to the gates of the driving transistors.

Figure 5E:
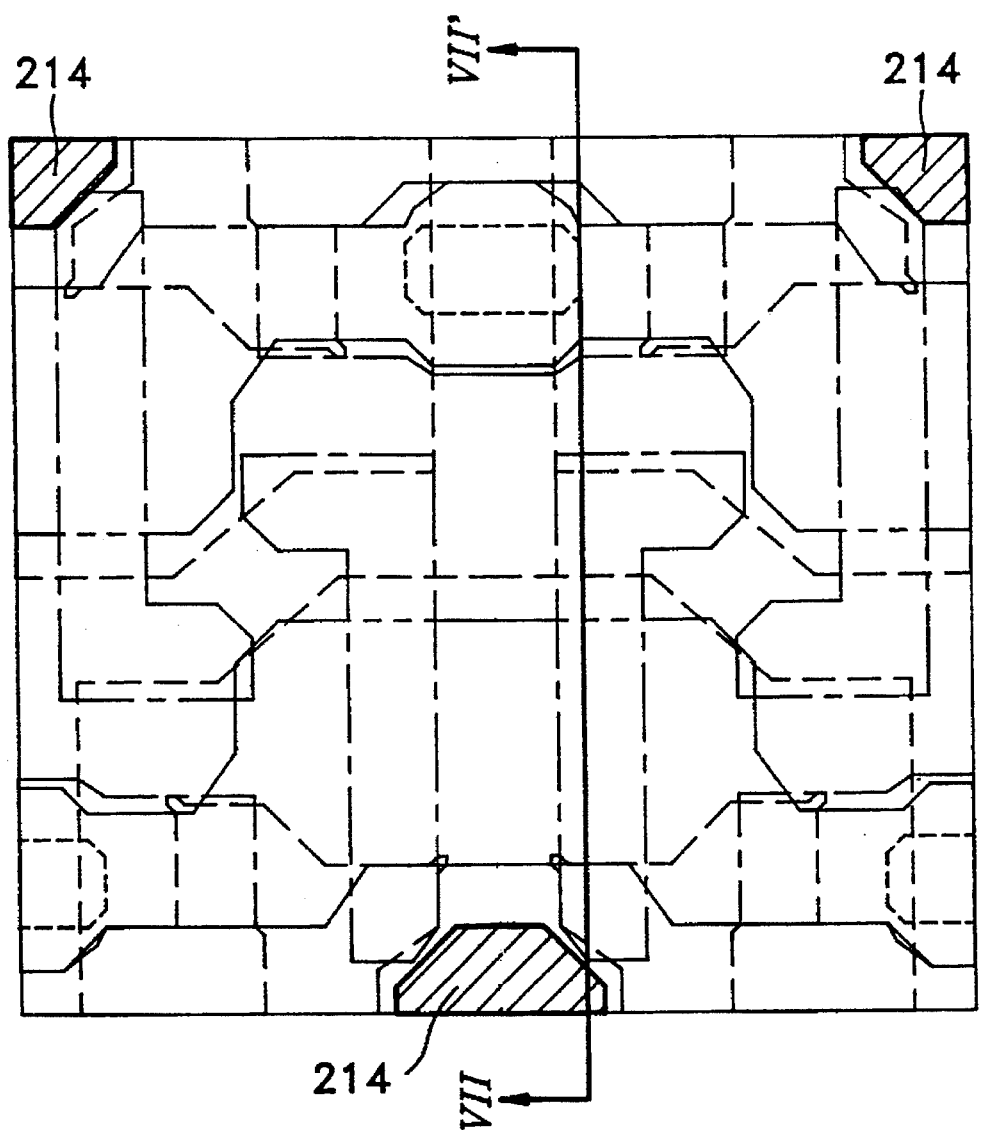
Figure 6E:
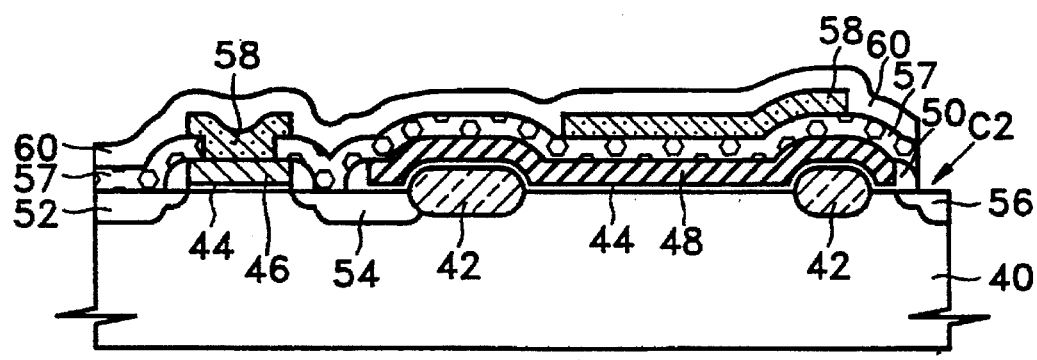

FIGS. 5E and 6E show the process for forming a contact hole C2 for connecting the power line to the active region. The process is composed of the steps of: forming a second insulating layer 60 on the resultant structure on which word-line 58 is formed by depositing an insulator such as an HTO layer; and forming contact hole C2 for connecting the power line to source 56 of the driving transistor through the photolithography process using mask patterns 214.

As shown in FIG. 6E, contact hole C2 is formed according to the conventional photolithography process in which the contact hole for connecting the power line to the active region is formed to be self-aligned with respect to the driving transistor. As a result, a small contact hole is formed, to thereby decrease cell size.

Figure 1:
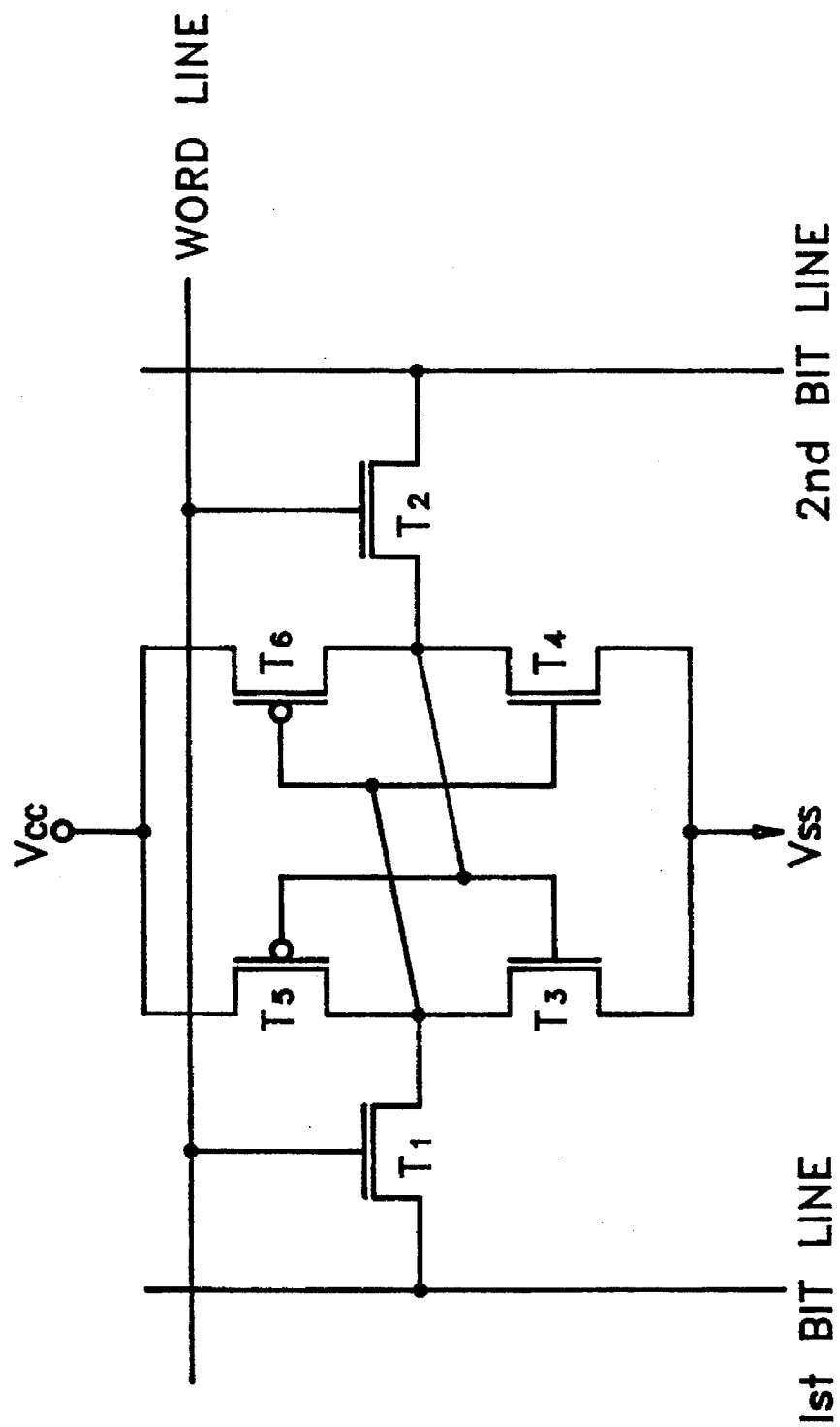
FIG. 1 is a circuit diagram of a static random access memory (SRAM) cell.
Figure 2:
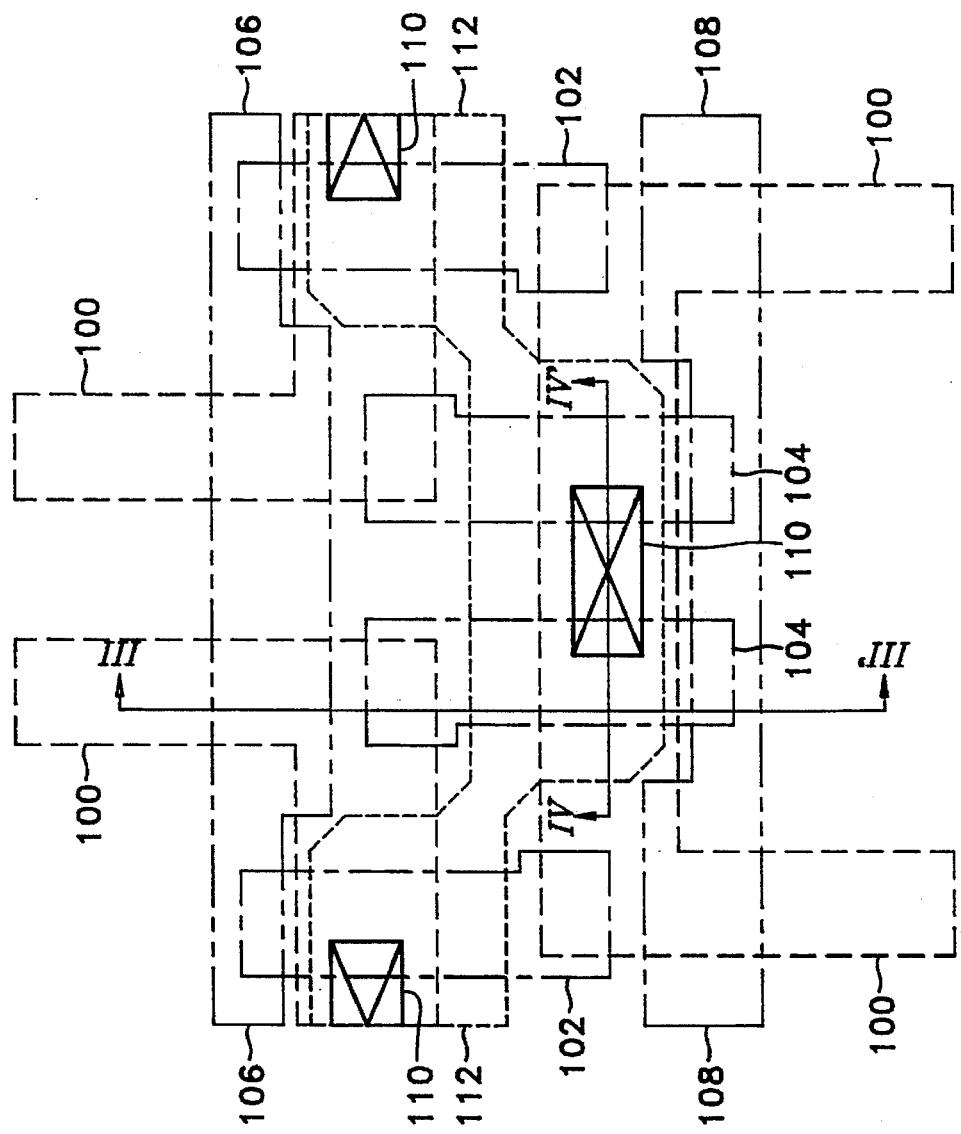
FIG. 2 is a conventional layout diagram used for obtaining the SRAM cell shown in FIG. 1.
Figure 3A:
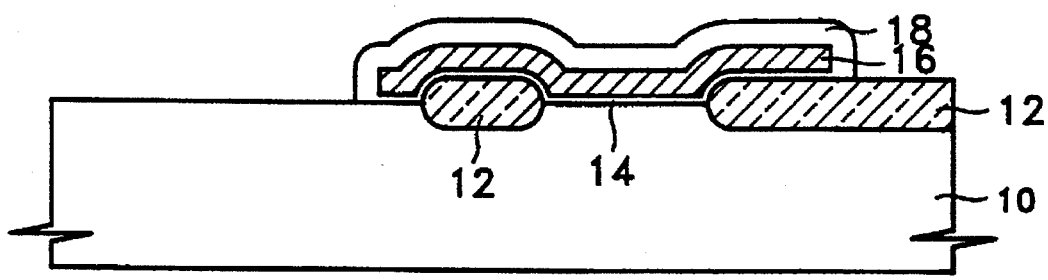
FIGS. 3A–3D are cross-sectional diagrams cut along line III—III' of FIG. 2, for illustrating a conventional SRAM cell manufacturing process.
Figure 3B:
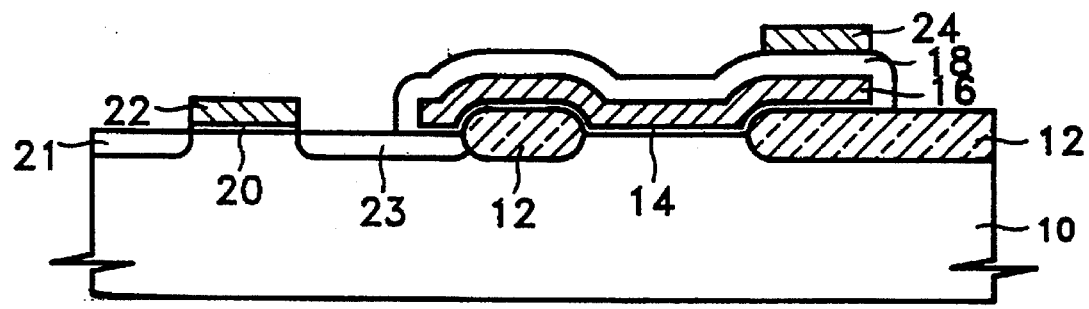
Figure 3C:
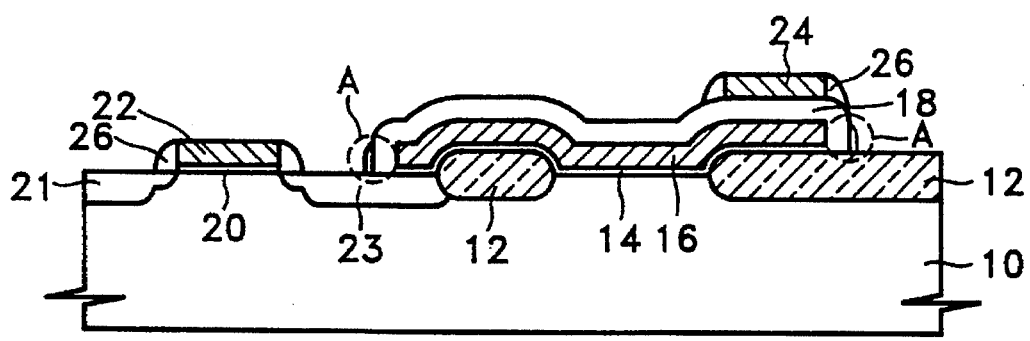
Figure 3D:
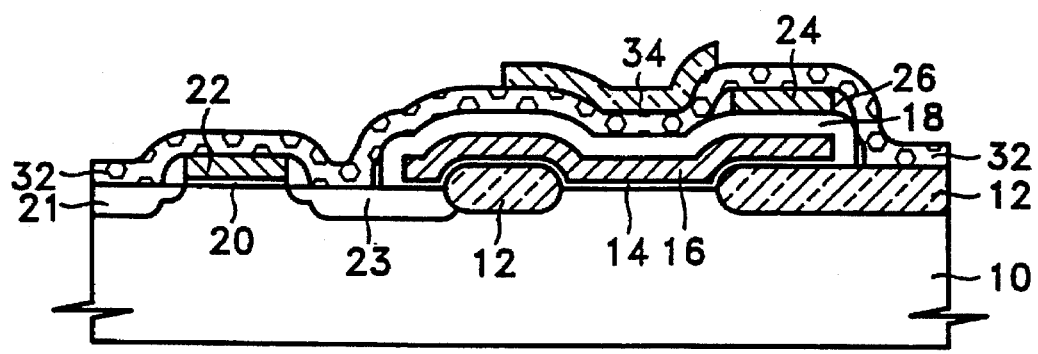
Figure 4A:
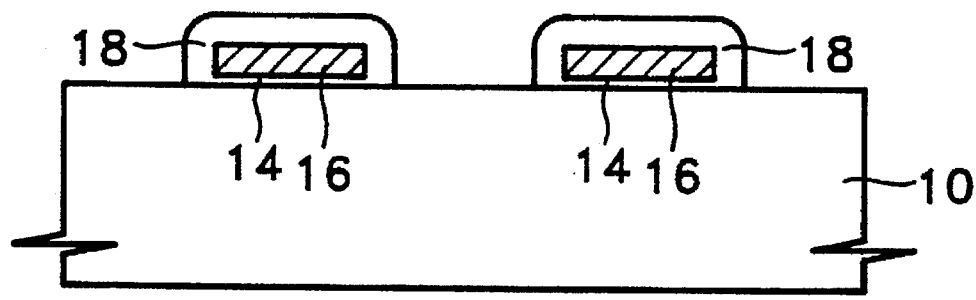
FIGS. 4A–4D are cross-sectional diagrams cut along line IV—IV' of FIG. 2, for illustrating a conventional SRAM cell manufacturing process.
Figure 4B:
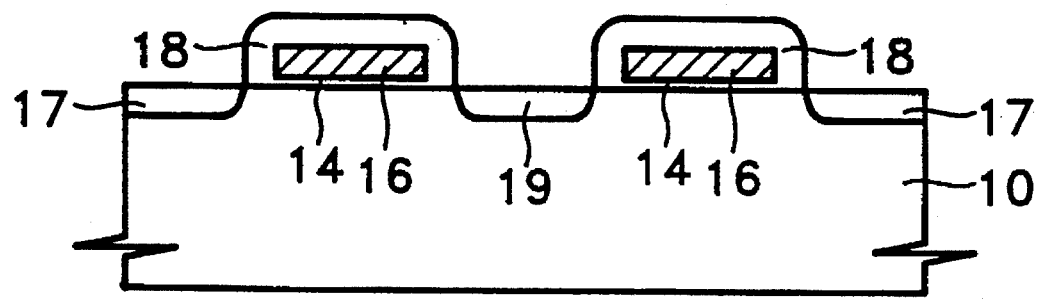
Figure 4C:
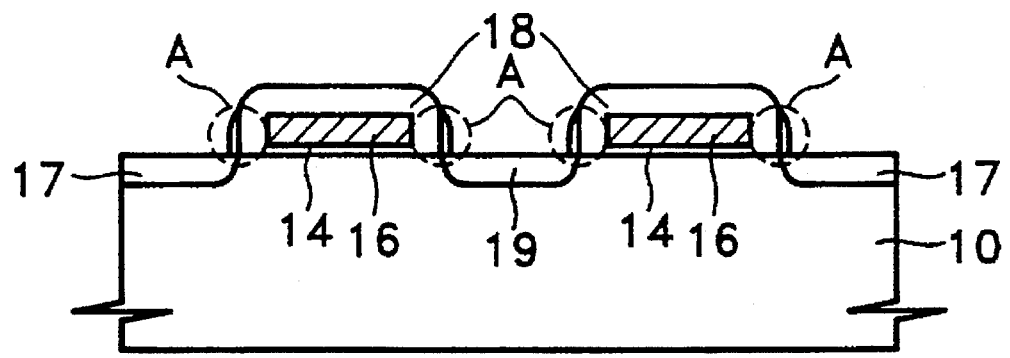
Figure 4D:
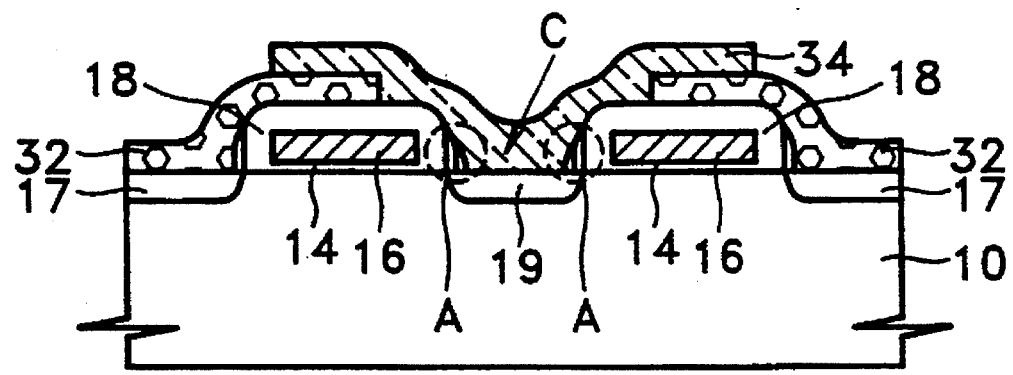

According to the present invention, the active region is designed as shown in FIG. 5A, so as to prevent the increase of the contact resistance by maximizing the size of the contact hole without increasing cell size. That is, according to the layout diagram of the conventional SRAM cell (see FIG. 2), since the active region is square or roughly circular in shape (i.e., annular), the center of the active region could not be used as a region for forming the contact hole for connecting the power line to the active region. In the present invention, however, with the active region being formed as a square or roughly circular shape having a central band (crossbar) which effectually bisects the conventional pattern (see FIG. 5A), the contact hole is placed in the center of the active region (see FIG. 5E), to thereby make the most of the remaining region of the cell. Thus, the size of the contact hole can be increased without increasing cell size, to thereby lower the contact resistance.

Figure 6F:
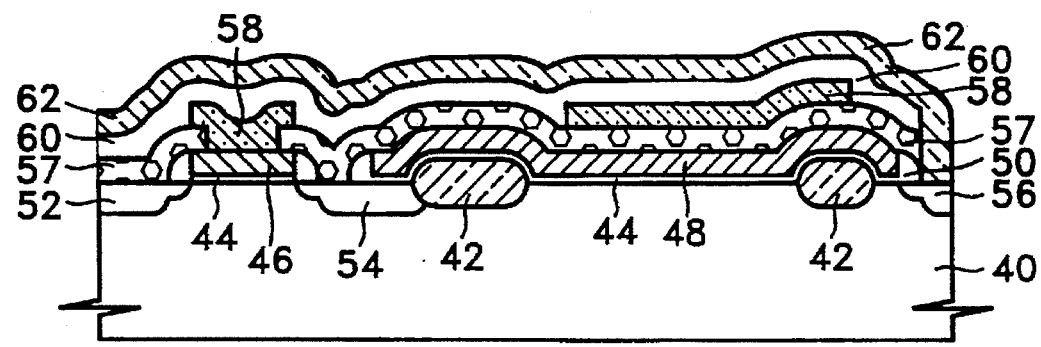

Referring to FIG. 6F showing the process for forming the power line 62, the second conductive layer for a power line is deposited on the resultant structure on which contact hole C2 for connecting the power line to the active region is formed.

In FIG. 6F, since the second conductive layer is not patterned after deposition (that is, no masking process is required), the power line is planar in shape. As a result, the power line resistance decreases and the planar power line can serve as a flat lower layer for the following process. Here, since the power line is formed without a masking process, there is, of course, no mask.

Figure 7A:
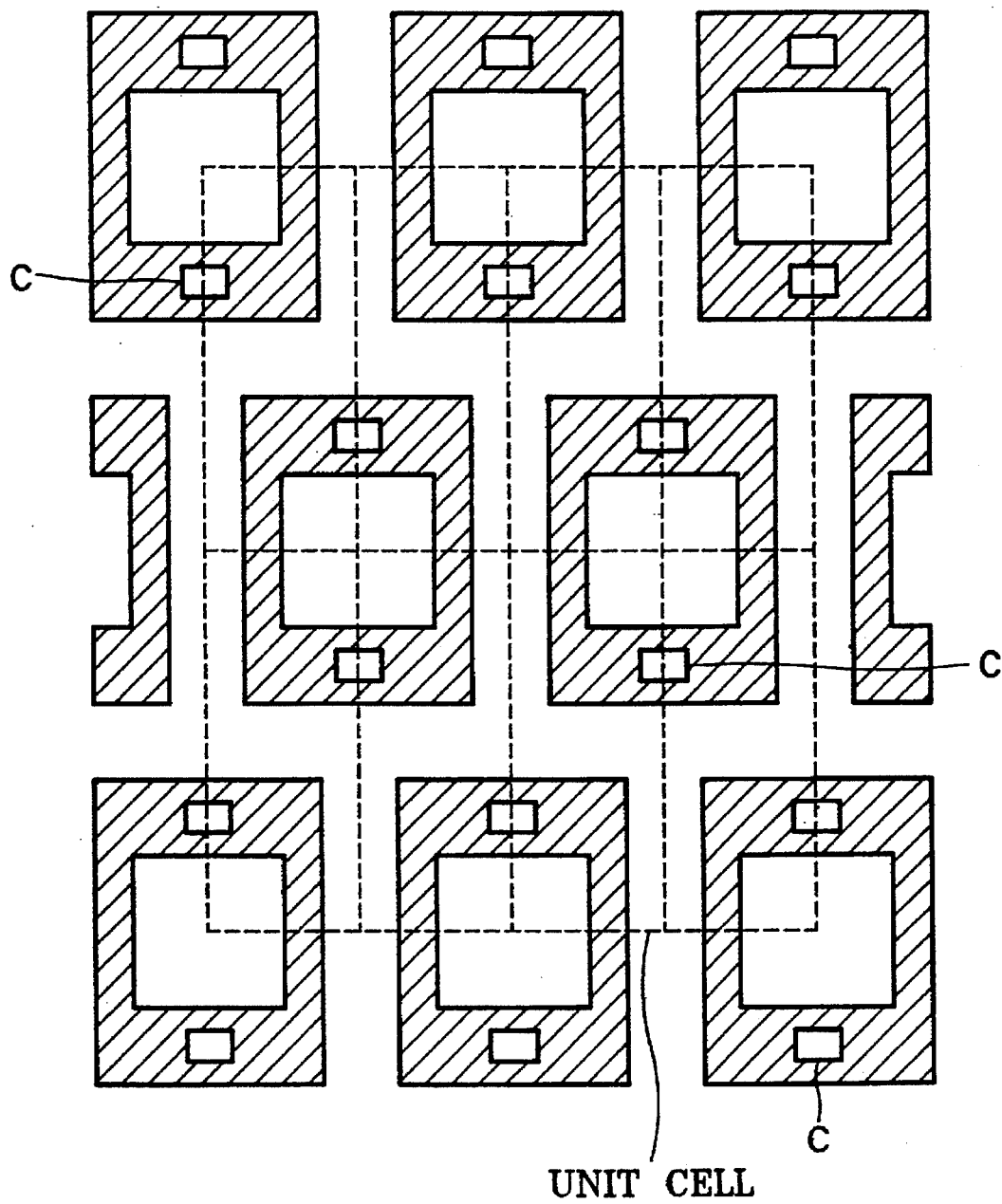
FIGS. 7A and 7B are diagrams showing a conventional active region of an SRAM cell and that according to the present invention, respectively.
Figure 7B:
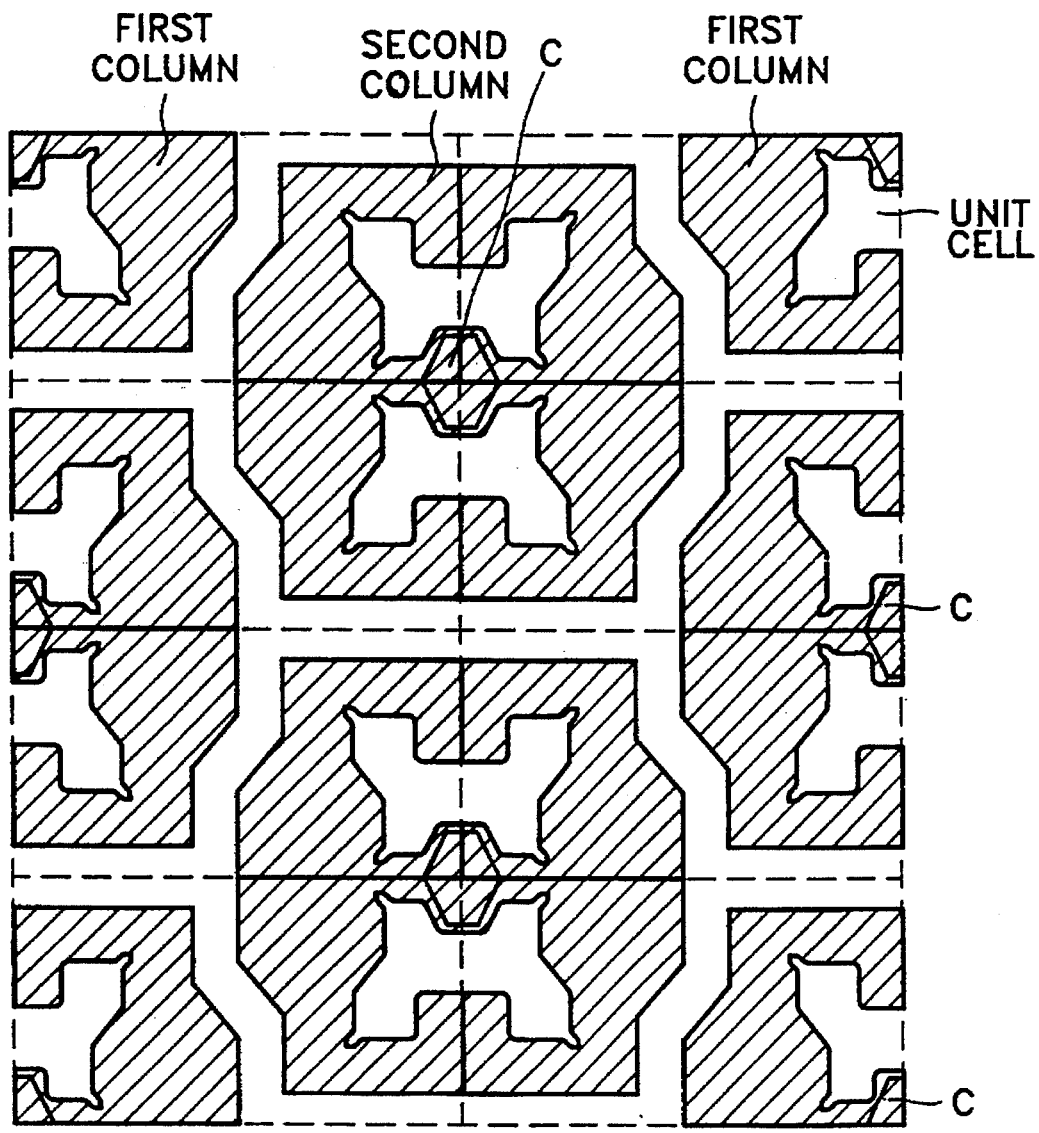

FIGS. 7A and 7B are diagrams showing the general active region of an SRAM cell and that according to the present invention, respectively.

The conventional active region has a simple annular shape, but the active region according to the present invention includes a crossbar bisecting the simple annulus. Also, according to the conventional active region, mask pattern C for forming the contact hole are placed on both sides of the active region. In contrast, according to the present invention, mask pattern C are arranged on the bisecting crossbar. In FIGS. 7A and 7B, the dashed line indicates a cell unit.

As shown in FIG. 7B, mask pattern C for forming the contact hole according to the present invention is placed on the center of the unit active region, so that the mask pattern is shared by four cells. Also, a first column in which the unit active regions are repeatedly placed and a second column in which the unit active regions are repeatedly placed while being shifted by ½ pitch along the column from the unit active regions placed in the first column are repeatedly placed over the whole cell array.

According to the present invention, since the contact hole for connecting the power line to the active region can be formed larger without increasing the cell size, the contact resistance can be decreased. Also, the manufacturing method can be simplified since just one gate oxide layer formation process is needed.

The present invention is not limited to the particular forms illustrated and further modifications and improvements will occur to those skilled in the art.

What is claimed is:

1. A static random access memory (SRAM) device, comprising:
   a unit active region including:
      an annular-shaped first portion, and
      a crossbar-shaped second portion which extends along a diameter of said first portion and which connects diametrically opposite points of said first portion; and
   a contact hole formed on said second portion of said unit active region.

2. An SRAM memory device as claimed in claim 1, further comprising:
   a power line formed over said unit active region, said power line electrically connecting with said unit active region through said contact hole.

3. An SRAM memory device as claimed in claim 1, wherein said unit active region is shared by four driving transistors and four transmitting transistors, and wherein said contact hole is formed on the sources of said four driving transistors.

4. An SRAM memory device as claimed in claim 2, wherein said power line comprises a planar layer of conductive material.

5. An SRAM memory device as claimed in claim 3, further comprising:
   word-line contact holes formed on the gates of said four transmitting transistors; and
   a word-line formed over said unit active region and connected to the gates of said four transmitting transistors via said word-line contact holes, wherein the gates of said four driving transistors and the gates of said four transmitting transistors are arranged on said annular-shaped first portion such that they are electrically isolated from each other, the gates of two of said driving transistors being arranged opposite the gates of the other two of said driving transistors such that the orientation of the gates of said driving transistors is parallel with respect to said crossbar-shaped second portion, the gates of two of said transmitting transistors being arranged opposite the gates of the other two of said transmitting transistors such that the orientation of the gates of said transmitting transistors is perpendicular with respect to said crossbar-shaped second portion.

6. An SRAM memory device as claimed in claim 5, wherein said word-line is formed perpendicular to the orientation of the gates of said driving transistors.

7. An SRAM memory device as claimed in claim 5, wherein said driving transistors and said transmitting transistors each have a lightly doped drain structure.

8. A memory device comprising:
   an array of rows and columns of unit active regions, said unit active regions being repeatedly formed in rows in each of said columns and arranged such that unit active regions in a first column are shifted by ½ row with respect to the unit active regions in a second column adjacent to said first column, each of said unit active regions including:
      an annular-shaped first portion, and
      a crossbar-shaped second portion which extends along a diameter of said first portion and which connects diametrically opposite points of said first portion;
   a plurality of contact holes respectively formed on said second portion of each of said unit active regions; and
   a power line formed over said unit active regions, said power line comprising a planar layer of conductive material and electrically connecting with each of said unit active regions through said contact holes.

9. A method for manufacturing a static random access memory (SRAM) device comprising the steps of:
   (a) forming an active region in a substrate, said active region including an annular-shaped first portion, and a crossbar-shaped second portion which extends along a diameter of said first portion and which connects diametrically opposite points of said first portion; and
   (b) forming a contact hole which partially exposes said second portion.

10. A method for manufacturing an SRAM memory device as claimed in claim 9, after said step (a), further comprising the steps of:
   (a') forming first and second driving transistor gates and first and second transmitting transistor gates on said active region;
   (b') forming word-line contact holes which expose portions of each gate of said first and second transmitting transistors; and
   (c') forming over said active region a word-line which is electrically connected to the gates of said first and second transmitting transistors via said word-line contact holes.

11. A method for manufacturing an SRAM memory device as claimed in claim 10, after said step (a'), further comprising the steps of:
   (a") implanting impurity ions on a first resultant structure on which the gates are formed;
   (b") forming an insulating layer on the whole surface of the first resultant structure after said step (a");
   (c") forming spacers on sidewalls of the gates of said transistors by etching back said insulating layer; and (d") doping impurities on a second resultant structure on which said spacers are formed, to thereby form the source/drain of LDD structure.

12. A method for manufacturing an SRAM memory device as claimed in claim 9, after step (b), further comprising the step of:

(a''') forming a power line by forming over said active region a planar layer of conductive material which electrically connects to said second portion via said contact hole.

* * * * *